US008966409B2

(12) United States Patent
He et al.

(10) Patent No.: US 8,966,409 B2
(45) Date of Patent: Feb. 24, 2015

(54) METHODS OF FORMING A MASK AND METHODS OF CORRECTING INTRA-FIELD VARIATION ACROSS A MASK DESIGN USED IN PHOTOLITHOGRAPHIC PROCESSING

(71) Applicant: Micron Technology, Inc., Boise, ID (US)

(72) Inventors: Yuan He, Boise, ID (US); Hong Chen, Boise, ID (US); David A. Kewley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/722,909

(22) Filed: Dec. 20, 2012

(65) Prior Publication Data

US 2014/0181763 A1   Jun. 26, 2014

(51) Int. Cl.
    *G06F 17/50*   (2006.01)
(52) U.S. Cl.
    CPC ................................. *G06F 17/5068* (2013.01)
    USPC .................. 716/50; 716/51; 716/52; 716/53; 716/54; 716/55; 430/5; 430/30
(58) Field of Classification Search
    USPC ..................................... 716/50–56; 430/5, 30
    See application file for complete search history.

(56) References Cited

U.S. PATENT DOCUMENTS

| | | | |
|---|---|---|---|
| 6,208,747 B1 * | 3/2001 | Nguyen et al. | 382/100 |
| 6,566,016 B1 * | 5/2003 | Ziger | 430/5 |
| 6,590,219 B1 * | 7/2003 | Ziger | 250/492.2 |
| 7,150,949 B2 | 12/2006 | Askebjer et al. | |
| 7,356,380 B2 * | 4/2008 | Yu et al. | 700/121 |
| 7,483,804 B2 * | 1/2009 | Scheer | 702/127 |
| 7,572,572 B2 * | 8/2009 | Wells | 430/311 |
| 7,745,072 B2 * | 6/2010 | Jung et al. | 430/5 |
| 2003/0157415 A1 * | 8/2003 | Ziger | 430/5 |
| 2004/0158808 A1 * | 8/2004 | Hansen | 716/21 |
| 2006/0183025 A1 | 8/2006 | Yang et al. | |
| 2010/0151364 A1 * | 6/2010 | Ye et al. | 430/5 |
| 2011/0093823 A1 * | 4/2011 | Lee et al. | 716/50 |

(Continued)

OTHER PUBLICATIONS

Design and analysis of across-chip linwidth variation for printed features at 130 nm and below; Abstract Only; Chen et al.; SPIE|Proceeding; Conference vol. 3998; Feb. 27, 2000; 2 pp.

(Continued)

*Primary Examiner* — Nha Nguyen
(74) *Attorney, Agent, or Firm* — Wells St. John, P.S.

(57) ABSTRACT

A method of forming a mask includes creating a difference map between a desired intra-field pattern that is to be formed on substrates and an intra-field signature pattern. The intra-field signature pattern represents a pattern formed on an example substrate by an exposure field using an example E-beam-written mask. Modifications are determined to formation of mask features to be made using an E-beam mask writer if forming a modified E-beam-written mask having mask features modified from that of the example E-beam-written mask that will improve substrate feature variation identified in the difference map. The E-beam mask writer is programmed using the determined modifications to improve the substrate feature variation identified in the difference map. It is used to form the modified E-beam-written mask having the modified mask features. One or more substrates are photolithographically processed using the modified E-beam-written mask.

29 Claims, 12 Drawing Sheets

(56) References Cited

U.S. PATENT DOCUMENTS

| | | |
|---|---|---|
| 2011/0211748 A1 | 9/2011 | Xiao et al. |
| 2012/0021343 A1* | 1/2012 | Ye et al. ............................ 430/5 |
| 2012/0217421 A1 | 8/2012 | Fujimura et al. |
| 2012/0244460 A1 | 9/2012 | Yu et al. |
| 2012/0264063 A1* | 10/2012 | Yu et al. ....................... 430/313 |
| 2013/0078558 A1* | 3/2013 | Hotzel ............................ 430/30 |
| 2013/0239073 A1* | 9/2013 | Yu et al. ........................ 716/55 |
| 2013/0252176 A1* | 9/2013 | Koike et al. ................... 430/319 |

OTHER PUBLICATIONS

E-beam Lithography for Micro-/nanofabrication; AIP biomicrofluidics; Altissimo, M.; Jun. 15, 2010; 4 pp.

Electron Beam Mask Writer EBM-7000 for Hp 32nm Generation; Kamikubo et al.; Proc. of SPIE, vol. 7488; 2009; pp. 74881E-1-74881E-8.

Flare and lens aberration for EUV lilthographic tools; Abstract Only; Jonckheere et al.; SPIE|Proceeding; Conference vol. 5751; Feb. 27, 2005; 2 pp.

Full field EUV lithography turning into a reality at IMEC; Abstract Only; Jonckheere et al.;SPIE|Proceeding; Conference vol. 6607; Apr. 17, 2007; 2 pp.

Modelling strategies for the incorporation of optical effects in EUVL; Abstract Only; Pathak et al.; ScienceDirect.com; Microelectronic Engineering, vol. 86, Issues 4-6; Apr.-Jun. 2009; 2 pp.

Performance Comparison of techniques for intra-field CD Control Improvement; Pforr et al.; Proc. SPIE 6730, Photomask Technology 2007; Oct. 30, 2007; 9 pp.

* cited by examiner

FIG. 3

| WCD_X | 1 | 2 | 3 | 4 | 5 | 6 | 7 | 8 | 9 | 10 | 11 | 12 |
|---|---|---|---|---|---|---|---|---|---|---|---|---|
| 1 | 46.17 | 46.97 | 46.20 | 46.72 | 46.70 | 46.48 | 46.61 | 46.34 | 46.30 | 46.47 | 46.19 | 46.46 |
| 2 | 46.28 | 46.62 | 46.58 | 47.11 | 46.11 | 46.99 | 46.30 | 47.60 | 46.22 | 47.60 | 46.55 | 46.29 |
| 3 | 46.68 | 46.44 | 47.54 | 47.35 | 47.93 | 48.72 | 47.34 | 49.10 | 48.01 | 48.50 | 48.80 | 47.01 |
| 4 | 46.04 | 47.48 | 48.58 | 49.72 | 48.96 | 48.90 | 48.80 | 49.50 | 49.08 | 48.98 | 48.80 | 47.20 |
| 5 | 46.19 | 48.77 | 49.72 | 48.99 | 49.60 | 49.02 | 49.85 | 49.06 | 49.29 | 49.82 | 48.38 | 47.14 |
| 6 | 46.06 | 47.56 | 48.32 | 49.18 | 49.00 | 49.39 | 49.65 | 49.47 | 49.71 | 49.12 | 49.84 | 47.00 |
| 7 | 46.60 | 47.86 | 49.41 | 48.41 | 49.61 | 49.84 | 49.15 | 49.04 | 48.82 | 49.09 | 49.57 | 47.71 |
| 8 | 46.10 | 47.82 | 49.12 | 48.62 | 48.96 | 49.34 | 49.16 | 49.64 | 49.12 | 49.10 | 49.46 | 47.81 |
| 9 | 46.19 | 47.30 | 48.36 | 48.76 | 48.35 | 49.01 | 49.98 | 49.20 | 49.28 | 48.95 | 49.26 | 47.90 |
| 10 | 46.28 | 47.12 | 47.48 | 48.65 | 47.74 | 48.62 | 47.92 | 49.27 | 48.22 | 48.01 | 47.64 | 47.97 |
| 11 | 46.59 | 46.47 | 47.40 | 47.05 | 47.96 | 47.81 | 46.31 | 47.73 | 46.74 | 46.58 | 47.36 | 47.00 |
| 12 | 46.70 | 46.53 | 46.49 | 46.79 | 47.08 | 46.36 | 46.13 | 46.20 | 46.12 | 46.32 | 47.03 | 46.03 |

CD Minor (nm)

FIG. 4

| WCD_Y | 1 | 2 | 3 | 4 | 5 | 6 | 7 | 8 | 9 | 10 | 11 | 12 |
|---|---|---|---|---|---|---|---|---|---|---|---|---|
| 1 | 57.02 | 57.26 | 56.68 | 57.56 | 57.35 | 57.17 | 57.21 | 56.93 | 56.50 | 57.31 | 56.60 | 56.55 |
| 2 | 56.32 | 57.58 | 56.80 | 57.60 | 56.24 | 57.21 | 56.81 | 57.81 | 56.56 | 57.97 | 56.38 | 56.79 |
| 3 | 57.54 | 56.40 | 56.91 | 56.40 | 57.15 | 58.70 | 57.03 | 58.95 | 57.57 | 57.91 | 57.94 | 57.41 |
| 4 | 56.29 | 57.35 | 57.65 | 59.24 | 58.92 | 58.72 | 58.35 | 59.39 | 58.32 | 58.03 | 57.92 | 57.26 |
| 5 | 57.08 | 57.93 | 59.12 | 58.34 | 58.97 | 58.92 | 59.29 | 58.14 | 58.66 | 59.03 | 57.80 | 57.42 |
| 6 | 57.00 | 56.85 | 57.89 | 58.74 | 58.78 | 58.41 | 59.56 | 58.73 | 59.56 | 59.09 | 59.51 | 57.53 |
| 7 | 57.12 | 57.73 | 59.07 | 57.92 | 58.96 | 59.67 | 58.70 | 58.70 | 57.99 | 58.76 | 58.99 | 57.82 |
| 8 | 57.10 | 57.37 | 58.71 | 57.80 | 58.94 | 58.47 | 58.36 | 58.81 | 58.41 | 58.35 | 58.48 | 58.00 |
| 9 | 56.65 | 56.86 | 57.59 | 57.99 | 57.83 | 58.22 | 59.59 | 58.58 | 59.21 | 58.14 | 59.08 | 58.55 |
| 10 | 57.17 | 56.36 | 57.16 | 56.63 | 57.51 | 58.52 | 57.54 | 58.31 | 57.35 | 57.88 | 56.72 | 58.04 |
| 11 | 56.78 | 56.56 | 58.32 | 57.19 | 58.08 | 58.50 | 56.47 | 58.27 | 57.27 | 56.68 | 58.34 | 57.88 |
| 12 | 57.43 | 57.33 | 56.77 | 57.37 | 57.14 | 57.06 | 56.30 | 56.37 | 56.17 | 57.25 | 57.33 | 56.18 |

CD Major (nm)

| Ratio | 1 | 2 | 3 | 4 | 5 | 6 | 7 | 8 | 9 | 10 | 11 | 12 |
|---|---|---|---|---|---|---|---|---|---|---|---|---|
| 1 | 1.235 | 1.219 | 1.227 | 1.232 | 1.228 | 1.230 | 1.227 | 1.229 | 1.220 | 1.233 | 1.225 | 1.217 |
| 2 | 1.217 | 1.235 | 1.219 | 1.223 | 1.220 | 1.217 | 1.227 | 1.214 | 1.224 | 1.218 | 1.215 | 1.227 |
| 3 | 1.233 | 1.214 | 1.197 | 1.191 | 1.192 | 1.205 | 1.205 | 1.201 | 1.199 | 1.194 | 1.187 | 1.221 |
| 4 | 1.223 | 1.208 | 1.187 | 1.192 | 1.204 | 1.201 | 1.196 | 1.200 | 1.190 | 1.185 | 1.187 | 1.213 |
| 5 | 1.236 | 1.188 | 1.189 | 1.191 | 1.189 | 1.202 | 1.189 | 1.185 | 1.190 | 1.185 | 1.195 | 1.218 |
| 6 | 1.237 | 1.195 | 1.198 | 1.194 | 1.199 | 1.183 | 1.200 | 1.187 | 1.198 | 1.203 | 1.194 | 1.224 |
| 7 | 1.226 | 1.206 | 1.196 | 1.197 | 1.188 | 1.197 | 1.194 | 1.197 | 1.188 | 1.197 | 1.190 | 1.212 |
| 8 | 1.238 | 1.200 | 1.195 | 1.189 | 1.204 | 1.185 | 1.187 | 1.185 | 1.189 | 1.188 | 1.183 | 1.213 |
| 9 | 1.226 | 1.202 | 1.191 | 1.189 | 1.196 | 1.188 | 1.192 | 1.191 | 1.202 | 1.188 | 1.199 | 1.222 |
| 10 | 1.235 | 1.196 | 1.204 | 1.214 | 1.205 | 1.204 | 1.201 | 1.184 | 1.189 | 1.205 | 1.191 | 1.210 |
| 11 | 1.219 | 1.217 | 1.230 | 1.215 | 1.210 | 1.224 | 1.219 | 1.221 | 1.225 | 1.217 | 1.232 | 1.231 |
| 12 | 1.230 | 1.232 | 1.221 | 1.226 | 1.214 | 1.231 | 1.221 | 1.220 | 1.218 | 1.236 | 1.219 | 1.220 |

Aspect Ratio: Major / Minor

| WCD_X Target | 1 | 2 | 3 | 4 | 5 | 6 | 7 | 8 | 9 | 10 | 11 | 12 |
|---|---|---|---|---|---|---|---|---|---|---|---|---|
| 1 | 49.83 | 49.08 | 49.80 | 49.28 | 49.30 | 49.52 | 49.39 | 49.66 | 49.70 | 49.53 | 49.81 | 49.54 |
| 2 | 49.72 | 49.38 | 49.42 | 48.89 | 49.89 | 49.01 | 49.70 | 48.40 | 49.78 | 48.40 | 49.45 | 49.71 |
| 3 | 49.32 | 49.56 | 48.46 | 48.65 | 48.07 | 47.28 | 48.66 | 46.90 | 47.99 | 47.50 | 47.20 | 48.99 |
| 4 | 49.96 | 48.52 | 47.42 | 46.28 | 47.04 | 47.10 | 47.20 | 46.50 | 46.97 | 47.02 | 47.20 | 48.80 |
| 5 | 49.81 | 47.23 | 46.28 | 47.01 | 46.40 | 46.98 | 46.15 | 46.94 | 46.71 | 46.18 | 47.62 | 48.86 |
| 6 | 49.94 | 48.44 | 47.68 | 46.82 | 47.00 | 46.61 | 46.35 | 46.53 | 46.29 | 46.88 | 46.16 | 49.00 |
| 7 | 49.40 | 48.14 | 46.59 | 47.59 | 46.39 | 46.16 | 46.85 | 46.96 | 47.18 | 46.91 | 46.43 | 48.29 |
| 8 | 49.90 | 48.18 | 46.88 | 47.38 | 47.04 | 46.66 | 46.84 | 46.36 | 46.88 | 46.90 | 46.54 | 48.19 |
| 9 | 49.81 | 48.70 | 47.64 | 47.24 | 47.65 | 46.99 | 46.02 | 46.80 | 46.72 | 47.05 | 46.74 | 48.10 |
| 10 | 49.72 | 48.88 | 48.52 | 49.35 | 48.26 | 47.38 | 48.08 | 46.73 | 47.78 | 47.99 | 48.36 | 48.03 |
| 11 | 49.41 | 49.53 | 48.60 | 48.95 | 48.04 | 48.19 | 49.69 | 48.27 | 49.26 | 49.42 | 48.64 | 49.00 |
| 12 | 49.30 | 49.47 | 49.51 | 49.21 | 48.92 | 49.64 | 49.87 | 49.80 | 49.88 | 49.68 | 48.97 | 49.97 |

Substrate CD Minor Target (nm)

FIG. 7

| WCD_Y Target | 1 | 2 | 3 | 4 | 5 | 6 | 7 | 8 | 9 | 10 | 11 | 12 |
|---|---|---|---|---|---|---|---|---|---|---|---|---|
| 1 | 60.98 | 60.74 | 61.32 | 60.44 | 60.65 | 60.83 | 60.79 | 61.07 | 61.50 | 60.69 | 61.40 | 61.45 |
| 2 | 61.68 | 60.42 | 61.20 | 60.40 | 61.76 | 60.79 | 61.19 | 60.19 | 61.44 | 60.03 | 61.42 | 61.21 |
| 3 | 60.46 | 61.60 | 61.09 | 61.60 | 60.85 | 59.30 | 60.97 | 59.05 | 60.43 | 60.09 | 60.06 | 60.59 |
| 4 | 61.71 | 60.65 | 60.35 | 58.76 | 59.08 | 59.28 | 59.65 | 58.61 | 59.68 | 59.97 | 60.08 | 60.74 |
| 5 | 60.92 | 60.07 | 58.88 | 59.66 | 59.03 | 59.08 | 58.71 | 59.86 | 59.34 | 58.97 | 60.20 | 60.58 |
| 6 | 61.00 | 61.15 | 60.11 | 59.26 | 59.22 | 59.59 | 58.44 | 59.27 | 58.44 | 58.91 | 58.49 | 60.47 |
| 7 | 60.88 | 60.27 | 58.93 | 60.08 | 59.04 | 58.33 | 59.30 | 59.30 | 60.01 | 59.24 | 59.01 | 60.18 |
| 8 | 60.90 | 60.63 | 59.29 | 60.20 | 59.06 | 59.53 | 59.64 | 59.19 | 59.59 | 59.65 | 59.52 | 60.00 |
| 9 | 61.35 | 61.14 | 60.41 | 60.01 | 60.17 | 59.78 | 58.41 | 59.42 | 58.79 | 59.86 | 58.92 | 59.45 |
| 10 | 60.83 | 61.64 | 60.84 | 61.37 | 60.49 | 59.48 | 60.46 | 59.69 | 60.65 | 60.12 | 61.28 | 59.96 |
| 11 | 61.22 | 61.44 | 59.68 | 60.81 | 59.97 | 59.50 | 61.53 | 59.73 | 60.73 | 61.32 | 59.66 | 60.12 |
| 12 | 60.57 | 60.67 | 61.23 | 60.63 | 60.86 | 60.94 | 61.70 | 61.63 | 61.83 | 60.75 | 60.67 | 61.82 |

Substrate CD Major Target (nm)

| Wafer CD1 (nm) | Mask CD Width (nm) |
|---|---|
| 39.5006 | 60 |
| 41.8091 | 60.5 |
| 44.0221 | 61 |
| 46.0752 | 61.5 |
| 48.0407 | 62 |
| 49.8953 | 62.5 |
| 51.6803 | 63 |
| 53.3639 | 63.5 |
| 55.0176 | 64 |

| MCD Width Target (nm) | 1 | 2 | 3 | 4 | 5 | 6 | 7 | 8 | 9 | 10 | 11 | 12 |
|---|---|---|---|---|---|---|---|---|---|---|---|---|
| 1 | 62.55 | 62.34 | 62.54 | 62.41 | 62.41 | 62.47 | 62.44 | 62.51 | 62.51 | 62.47 | 62.54 | 62.47 |
| 2 | 62.52 | 62.43 | 62.44 | 62.31 | 62.57 | 62.34 | 62.51 | 62.18 | 62.54 | 62.18 | 62.45 | 62.52 |
| 3 | 62.42 | 62.48 | 62.19 | 62.24 | 62.09 | 61.89 | 62.25 | 61.79 | 62.07 | 61.95 | 61.87 | 62.33 |
| 4 | 62.58 | 62.21 | 61.93 | 61.63 | 61.83 | 61.84 | 61.87 | 61.69 | 61.81 | 61.82 | 61.87 | 62.28 |
| 5 | 62.55 | 61.88 | 61.63 | 61.82 | 61.66 | 61.81 | 61.60 | 61.80 | 61.74 | 61.61 | 61.98 | 62.30 |
| 6 | 62.58 | 62.19 | 61.99 | 61.77 | 61.82 | 61.72 | 61.65 | 61.70 | 61.63 | 61.79 | 61.60 | 62.33 |
| 7 | 62.44 | 62.11 | 61.71 | 61.97 | 61.66 | 61.60 | 61.78 | 61.81 | 61.86 | 61.80 | 61.67 | 62.15 |
| 8 | 62.57 | 62.12 | 61.79 | 61.92 | 61.83 | 61.73 | 61.78 | 61.65 | 61.79 | 61.79 | 61.70 | 62.13 |
| 9 | 62.54 | 62.26 | 61.98 | 61.88 | 61.99 | 61.82 | 61.56 | 61.77 | 61.75 | 61.83 | 61.75 | 62.10 |
| 10 | 62.52 | 62.30 | 62.21 | 62.43 | 62.15 | 61.92 | 62.10 | 61.75 | 62.02 | 62.07 | 62.17 | 62.09 |
| 11 | 62.44 | 62.47 | 62.23 | 62.32 | 62.09 | 62.13 | 62.51 | 62.15 | 62.40 | 62.44 | 62.24 | 62.33 |
| 12 | 62.41 | 62.46 | 62.47 | 62.39 | 62.31 | 62.50 | 62.56 | 62.54 | 62.56 | 62.51 | 62.33 | 62.59 |

Table 1

Mask CD Width needed at each field location

FIG. 12

| MCD Height (nm) at given MCD width | 1 | 2 | 3 | 4 | 5 | 6 | 7 | 8 | 9 | 10 | 11 | 12 |
|---|---|---|---|---|---|---|---|---|---|---|---|---|
| 1 | 74.92 | 75.06 | 74.99 | 74.94 | 74.98 | 74.96 | 74.98 | 74.97 | 75.05 | 74.93 | 75.00 | 75.08 |
| 2 | 75.08 | 74.91 | 75.06 | 75.03 | 75.05 | 75.08 | 74.99 | 75.11 | 75.02 | 75.08 | 75.09 | 74.99 |
| 3 | 74.94 | 75.10 | 75.27 | 75.32 | 75.31 | 75.20 | 75.19 | 75.25 | 75.25 | 75.30 | 75.37 | 75.04 |
| 4 | 75.03 | 75.17 | 75.37 | 75.34 | 75.22 | 75.24 | 75.29 | 75.26 | 75.35 | 75.40 | 75.37 | 75.12 |
| 5 | 74.91 | 75.36 | 75.36 | 75.34 | 75.36 | 75.23 | 75.36 | 75.39 | 75.35 | 75.40 | 75.30 | 75.07 |
| 6 | 74.89 | 75.28 | 75.26 | 75.30 | 75.26 | 75.42 | 75.26 | 75.38 | 75.28 | 75.22 | 75.31 | 75.02 |
| 7 | 75.00 | 75.18 | 75.30 | 75.28 | 75.37 | 75.28 | 75.31 | 75.28 | 75.36 | 75.28 | 75.35 | 75.13 |
| 8 | 74.88 | 75.25 | 75.30 | 75.35 | 75.21 | 75.40 | 75.38 | 75.40 | 75.35 | 75.36 | 75.42 | 75.12 |
| 9 | 74.99 | 75.22 | 75.33 | 75.35 | 75.28 | 75.36 | 75.33 | 75.34 | 75.24 | 75.37 | 75.26 | 75.04 |
| 10 | 74.91 | 75.27 | 75.20 | 75.11 | 75.20 | 75.21 | 75.23 | 75.41 | 75.34 | 75.19 | 75.33 | 75.15 |
| 11 | 75.06 | 75.08 | 74.96 | 75.09 | 75.15 | 75.02 | 75.06 | 75.05 | 75.00 | 75.08 | 74.95 | 74.95 |
| 12 | 74.96 | 74.94 | 75.04 | 75.00 | 75.11 | 74.95 | 75.04 | 75.05 | 75.07 | 74.91 | 75.06 | 75.05 |

Table 2
Mask CD Height needed at each field location

FIG. 14

METHODS OF FORMING A MASK AND METHODS OF CORRECTING INTRA-FIELD VARIATION ACROSS A MASK DESIGN USED IN PHOTOLITHOGRAPHIC PROCESSING

TECHNICAL FIELD

Embodiments disclosed herein pertain to methods of forming a mask and to methods of correcting intra-field variation across a mask design used in photolithographic processing.

BACKGROUND

Photolithographic processing includes forming a patterned image of radiation (i.e., actinic energy) onto a photosensitive material such as photoresist. The radiation alters exposed regions relative to unexposed regions. Subsequent development of the photosensitive material selectively removes the exposed regions relative to the unexposed regions, or vice-versa, to thereby pattern the photosensitive material on the substrate. Material underlying the patterned photosensitive material may then be processed through openings formed in the patterned photosensitive material.

The patterned image of radiation is formed by passing radiation through a mask and onto the photosensitive material. The mask itself may be formed by photolithography or other manners, for example using an E-beam mask writer. Some masks and corresponding applied energy are sufficient in size and quantity to pattern an entire wafer in a single exposure. Other masks (e.g., a reticle) only pattern a single small area of the wafer in a single exposure. The reticle and/or substrate are then stepped relative to one another to pattern other areas of the substrate until all desired areas of the substrate have been patterned with the mask.

The patterned image formed in the photosensitive material will have individual features of various size, shape, and spacing relative one another. Undesired variation from targeted size, shape, and/or spacing can occur within an exposure field created on the substrate using a mask. This is commonly referred to as intra-field variation, and can be caused by feature variations in the mask and imperfections in the projection tool in which the mask is received. The substrate feature variations may be in the form of variable critical dimension (CD) values in one or more directions relative to commonly sized, shaped, and spaced features. Additionally or alternately, the variations may be in the form of CD bias relative to differently sized, shaped, and/or spaced features. Existing techniques for improving intra-field substrate feature variation include one or both of exposure tool based techniques and mask based techniques. Exposure tool techniques typically use on-scan dose tuning combined with intra-slit intensity profiling. Dose tuning during stage movement can provide a change in CD values in the direction of scan. Change of CD values orthogonally to the scan direction can be achieved by optical filters within the illumination system or by a local long-slit variation of the slit height. Mask based techniques may include providing sub-resolution mask features adjacent certain of the resolving mask features. (As used herein, "mask feature" refers to a feature formed on the mask in question, whereas "substrate feature" refers to a feature that is formed on a substrate using the mask.) Mask based techniques may also include attenuating the light intensity by creating micro-holes in the mask substrate beneath the mask features Needs remain in fabrication of masks where undesired intra-field CD or other feature variation is minimized.

BRIEF DESCRIPTION OF THE DRAWINGS

FIGS. 3-7, 12, and 14 are matrices determined in accordance with one illustrative example of implementation of an embodiment of the invention.

DETAILED DESCRIPTION OF EXAMPLE EMBODIMENTS

Figure 1:
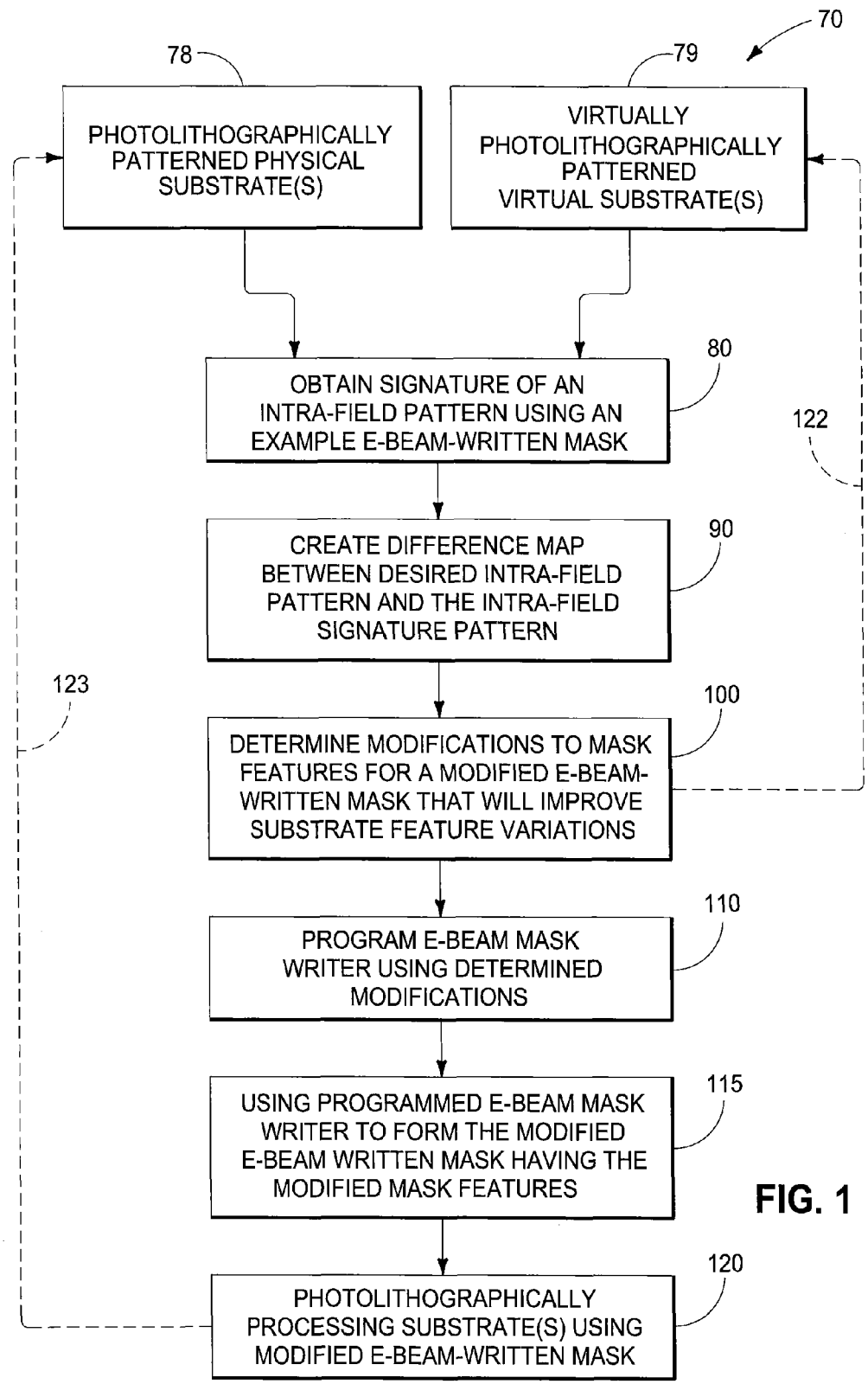
FIG. 1 is a flowchart diagram illustrating example embodiment methods of forming a mask and of correcting intra-field variation across a mask design used in photolithographic processing.

FIG. 1 provides a flowchart 70 illustrating example processing that may be used in forming a mask, and in correcting intra-field variation across a mask design used in a photolithographic process. The FIG. 1 processing includes obtaining a signature of an intra-field pattern as shown in step 80. The intra-field signature pattern represents a pattern formed on an example substrate by an exposure field (i.e., a single writing field or "shot") using an example E-beam-written mask. An intra-field signature pattern may be created by a given photolithography process flow or a given photolithography scanner type. It is usually a constant from substrate to substrate if the process and the scanner type are not changed. The intra-field signature pattern will likely have substrate feature variation relative to an intended or desired intra-field pattern that was to be formed on the example substrate.

Regardless, in one embodiment the intra-field signature pattern is derived from physical trial, such as where the example substrate is a physical substrate and the E-beam-written mask is a physical mask. For example with respect to a step 78, the represented pattern of the intra-field signature may be formed by lithographically patterning one or more physical substrates using the example physical mask and then deriving the intra-field signature pattern by scanning the patterned physical substrate(s). Such scanning may be conducted with any suitable methodology, including, for example, using a scanning electron microscope (SEM), using optical scatterometry, etc.

Alternately, the intra-field signature pattern may be derived from at least some simulation, for example where the example substrate is a virtual substrate and the example E-beam-written mask is a virtual mask. Example step 79 forms the represented pattern of the intra-field signature by virtually photolithographically patterning one or more virtual substrates with the virtual mask and deriving the intra-field signature pattern there-from. Such simulation may be conducted by people of skill in the art using any suitable wafer lithography simulators (e.g., TruMask™ product available from D2S, Inc. of San Jose, Calif.; Prolith™ product available from KLA-Tencor of Milpitas, Calif.; and Sentaurus Lithography™ product available from Synopsis, Inc. of Mountain View, Calif.).

The physical or virtual substrate(s) may correspond to semiconductor substrates, and may for example comprise a wafer of semiconductor material. For example, such wafer may comprise monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The wafer may be homogenous, or may comprise numerous materials in some embodiment. For instance the wafer may correspond to a semiconductor substrate containing one or more materials associated with integrated circuit fabrication. In such embodiments, such materials may correspond to one or more refractory metal materials, barrier materials, diffusion materials, dielectric materials, etc.

The substrate features of the desired intra-field pattern may largely be of uniform shape, size, and CD value relative one another, or may be of some variable size, shape, and/or CD value relative one another. Regardless, the intra-field signature pattern may include measuring one or more various dimensions along one or more directions at designated sampling locations across an exposure field, or completely across an exposure field, to obtain the intra-field signature pattern. It may be advantageous when conducting physical trial to use more than one substrate for generating the signature pattern. That signature pattern may then be an average across multiple substrates to better account for statistical variability that may be present in, for example, the measurement process, the photolithographic process underlying the signature pattern, and/or other variations in the substrate and/or processing.

Referring to step 90, a difference map is created to reflect the difference between the desired intra-field pattern that is to be formed on semiconductor or other substrates and the intra-field signature pattern. The difference map may be represented in analog and/or digital manners, and may catalog, for example, various distances and angles between substrate features to identify problematic regions where variation is occurring relative to the desired pattern. Further, the difference map may catalog various distances and/or angles between features across the entire exposure field. Regardless, for example, if the desired pattern is a repeating pattern of a memory array (such as a DRAM array, a NAND memory array, etc.), the difference map may identify where distances and/or angles vary by more than a statistically insignificant amount. Further, the difference map may identify regions where variation is outside of acceptable tolerances which might otherwise lead to fabrication of inoperable circuitry.

The difference map may comprise any suitable mathematical representation of differences between the desired intra-field pattern and the signature pattern. For instance, the difference map may include differences between distances measured in the desired pattern and the signature pattern along one or more directions common to the signature pattern and the desired pattern (e.g., at a common location). In one embodiment, the measured distances may be CD values. Regardless, in one embodiment, creating of the difference map includes comparison of distances along at least two different directions, and in one embodiment where those two directions are orthogonal to one another. In one embodiment, creating the difference map comprises creating a matrix of CD values along a given direction, and in one embodiment comprises creating matrices of CD values along different directions. In one embodiment, creating the difference map comprises creating two matrices of different respective directions that are orthogonal to one another.

Referring to step 100, modifications are determined to formation of mask features to be made using an E-beam writer if forming a modified E-beam-written mask having mask features modified from that of the example E-beam-written mask. The modified mask features will improve (i.e., reduce) substrate feature variation identified in the difference map. The determined modifications may be with respect to a single direction, or with respect to multiple different directions, and in one embodiment are at least with respect to two different directions that are orthogonal relative one another. Regardless, the determination of step 100 may be accomplished with any suitable method. For example, some E-beam mask writers use multiple E-beam exposures (i.e., "shots") in forming a single mask feature. Further, one or both of dose and E-beam shape (e.g., in two orthogonal x, y dimensions) can be varied for each shot. For example, many EBM™ products available from Nuflare Technology, Inc., of Kanagawa, Japan are E-beam writers capable of individual E-beam shape control and individual E-beam dose control. Further, E-beam simulation software (e.g., some TruMask™ product from D2S, Inc.) provides capability of changing mask pattern shapes as a function of one or both of E-beam shape and dose, and determining results therefrom by simulation.

In one embodiment, determining of the modifications comprises determining relationships among orthogonal x, y dimensions and variable E-beam dose if forming the modified mask features using multiple E-beam exposures in forming individual of the modified mask features, and in one embodiment if using multiple such exposures of constant shape and at least two different doses in forming the individual modified mask features. In one embodiment, the determining of the modifications comprises determining relationships among orthogonal x, y dimensions and variable E-beam shape if forming the modified mask features using multiple E-beam exposures in forming individual of the modified mask features, and in one embodiment if using multiple exposures of constant dose and at least two different shapes in forming the individual modified mask features.

Referring to step 110, the E-beam mask writer is programmed using the determined modifications to improve (i.e., reduce) the substrate feature variation identified in the difference map. For example with respect to E-beam writers capable of varying one or both of dose and shape where multiple shots are used in forming a single mask feature, those variables in accordance with the modifications can be programmed into the E-beam mask writer for the different features formed on the mask. This may be done on a feature-by-feature basis.

Referring to step 115, the programmed E-beam mask writer is used to form the modified E-beam-written mask having the modified mask features.

Referring to step 120, one or more substrates are photolithographically processed using the modified E-beam-written mask.

In one embodiment, the photolithographically processed substrates are semiconductor substrates, and such processing patterns one or more components of a memory array, in one embodiment a DRAM array, and in one embodiment a NAND array. In one embodiment, the modified mask is a reticle.

In one embodiment, the difference map compares distances along at least two different directions and the acts of programming and the ultimate forming of the modified mask improves substrate feature variation in those at least two different directions. In one embodiment, those two different directions are orthogonal relative one another.

In one embodiment, a feedback loop 122 may be used in creating multiple difference maps between the desired intra-field pattern and multiple intra-field signature patterns derived by simulation from forming different respective theoretical E-beam-written masks, wherein at least some subsequent of the theoretical E-beam-written masks would improve substrate feature variation identified in its difference map. Alternately or additionally, in one embodiment, a feedback loop 123 may be used in creating multiple difference maps between the desired intra-field pattern and multiple intra-field signature patterns derived by physical trial from forming different respective physical E-beam-written masks, wherein at least some subsequent of the physical E-beam-written masks improve substrate feature variation identified in its difference map.

Where sets of substrate features are used having different CD values, the improving of the substrate feature variation may be in terms of CD bias in at least one direction of different sized substrate features, and in one embodiment in two orthogonal directions of different sized substrate features. Further in some embodiments, both CD uniformity and CD bias variation are improved.

Figure 2:
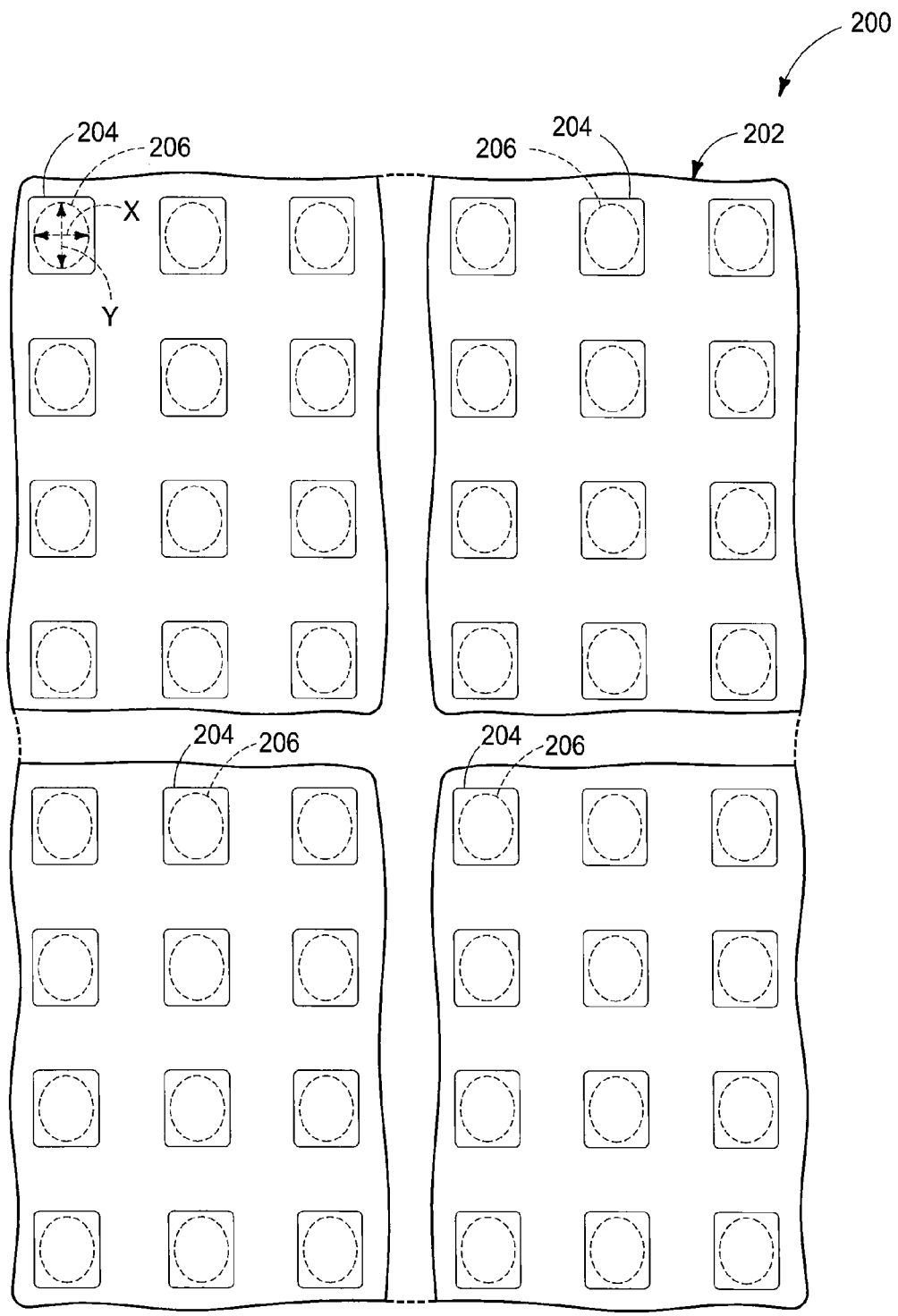
FIG. 2 is a fragmented diagrammatic top view of a portion of an example mask having commonly shaped, sized, and spaced features.

An example implementation of an embodiment of the above invention, and additionally including correcting intra-field variation across a mask design utilized in photolithographic processing, is described below with reference to FIGS. 2-15. The example assumes formation of a contact array of intended oval-shaped substrate features that result from rectangular mask features. FIG. 2 shows an example portion 202 of a physical or virtual example E-beam-written mask 200, for example as referred to above. Such includes mask features 204 intended to form oval-shaped substrate features 206 on a substrate using mask 202. Consider for purposes of the example that a targeted substrate CD major y-dimension is 59 nm, and a targeted substrate CD minor x-dimension is 48 nm, giving a targeted ratio of substrate major to substrate minor of 1.23, to achieve a desired intra-field pattern of oval-shaped substrate feature 206 on a substrate appropriately patterned using mask 202.

Referring to FIGS. 3, 4, and 5, a twelve-by-twelve matrix for a twelve-by-twelve portion of the contact array is shown in each figure. FIG. 3 shows substrate feature CD values for the FIG. 2 x-dimension. FIG. 4 shows substrate feature CD values for the FIG. 2 y-dimension (e.g., orthogonal to the x-dimension). FIG. 5 shows aspect ratio of y to x (major/minor). The x and y CD values may be derived using physical trial (i.e., physical mask and physical substrate[s]) or using simulation (i.e., virtual mask and virtual substrate[s]) with respect to an example substrate by an exposure field using example E-beam-written mask 200. Any of the FIGS. 3-5 matrices may alone or in combination be considered as an intra-field signature pattern in accordance with the above-described embodiments. Regardless, in one embodiment, a signature matrix of CD values for each of orthogonal x and y directions of substrate features in an intra-field signature pattern is created, for example as is shown in FIGS. 3 and 4. Additionally or alternately, pictorial intra-field signature pattern maps may be formed.

Referring to FIGS. 6 and 7, the matrix of FIG. 6 and the matrix of FIG. 7 either alone or in combination may be considered as an example difference map that has been created between a desired intra-field pattern that is to be formed on substrates and the intra-field signature pattern. Additionally or alternately, pictorial difference maps may be formed. FIG. 6 in one embodiment may be considered as creation of a modified x-substrate matrix, and FIG. 7 in one embodiment may be considered as creation of a modified y-substrate matrix. The depicted values shown represent substrate feature target CD (either 48 nm or 59 nm) minus the substrate feature measured CD (as shown in FIG. 3 or FIG. 4) plus the substrate feature target CD (48 nm or 59 nm). Accordingly and in one embodiment, the modified x and y substrate matrices of FIGS. 6 and 7, respectively, have calculated CD values that erase deltas from target x CD values and from target y CD values for the respective substrate features.

Figure 8:
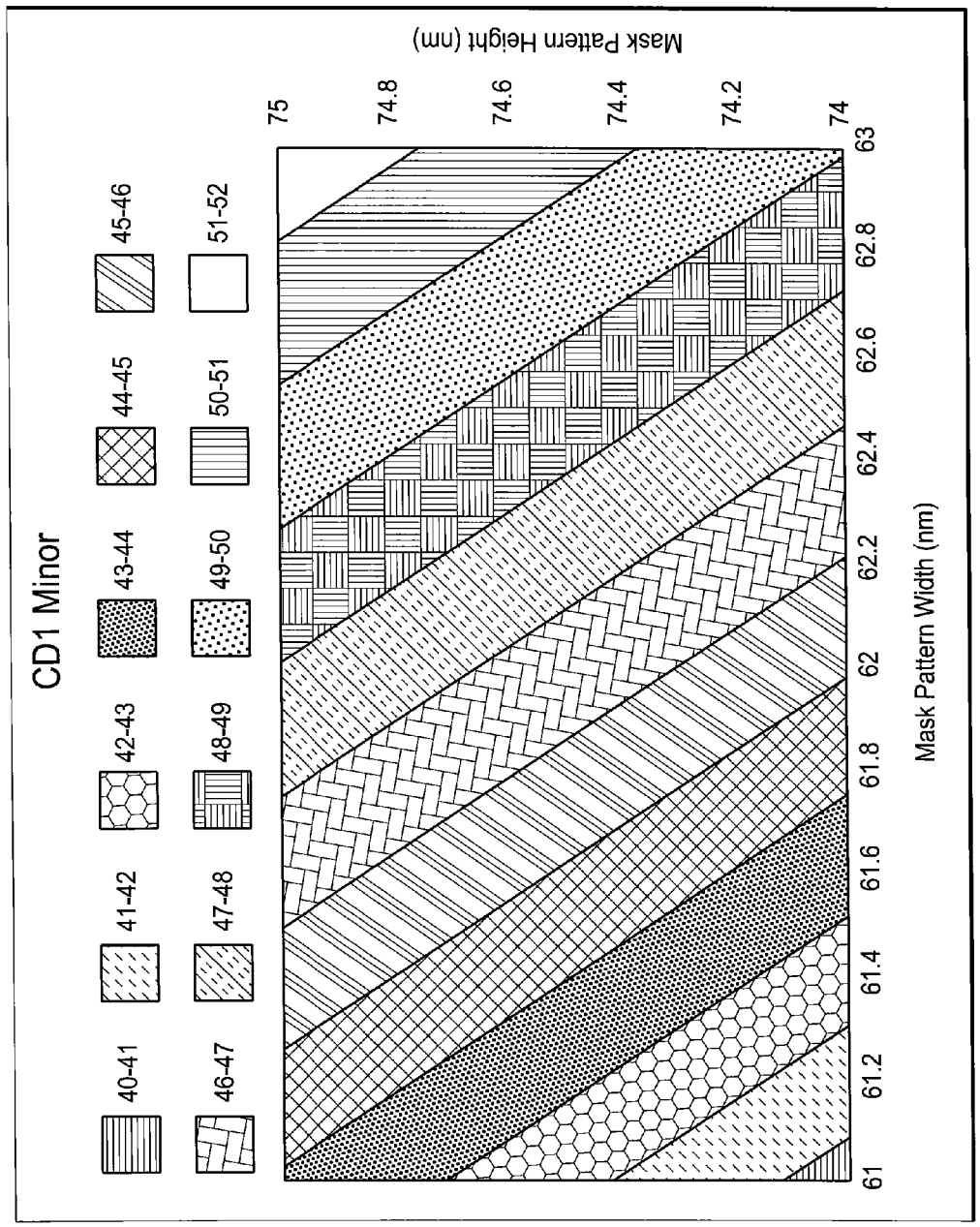
FIGS. 8, 9, and 13 are diagrammatic plots that include mask pattern width as a function of mask pattern height in accordance with aspects of the illustrative example.
Figure 9:
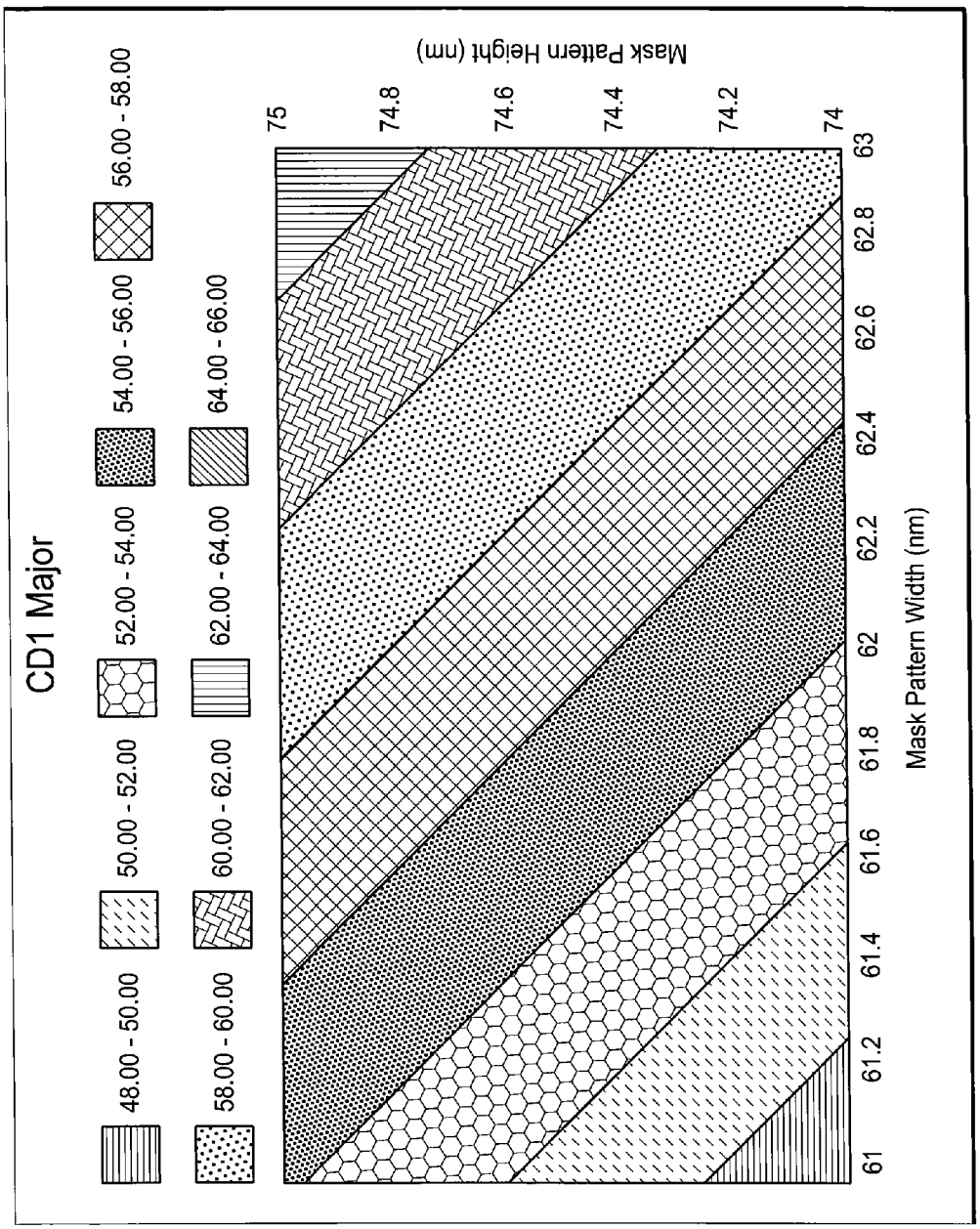
Figures 10, 11:
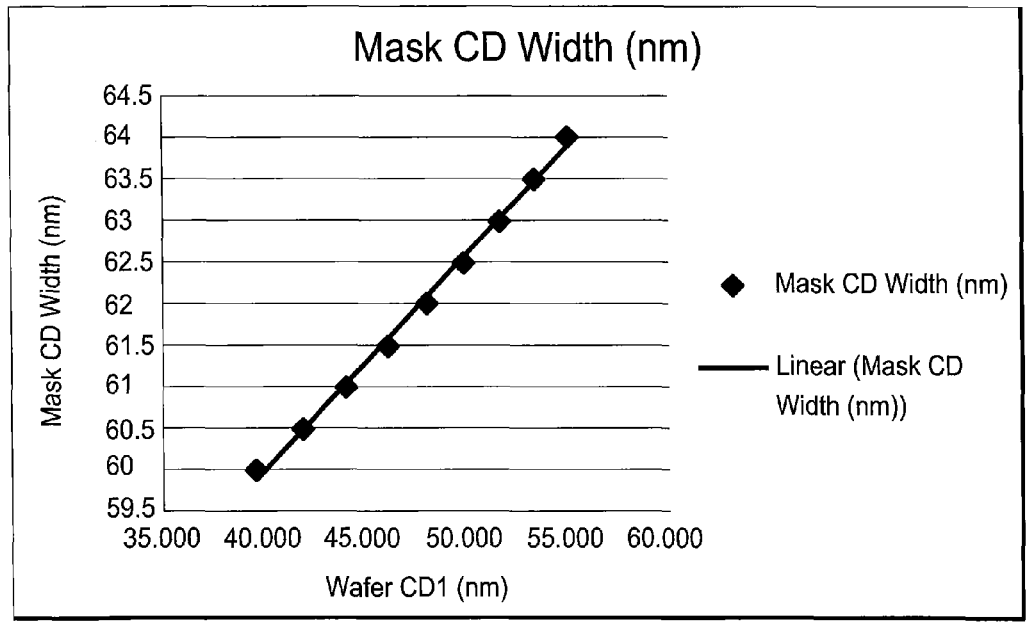
FIG. 10 is a table and FIG. 11 a plot/graph associated with the illustrative example.

Refer now to FIG. 8-11. FIG. 8 reports predicted substrate feature x values vs. mask feature x and y values, and FIG. 9 reports predicted substrate feature y values vs. mask feature x and y values. By fixing or setting a mask feature height at 75 nm, one may arrive at the following formula per FIGS. 9 and 10:

$$\text{Mask pattern feature width }(x)=(0.2581\times\text{substrate feature width }(x))+49.688 \quad \text{(Equation 1)}$$

Accordingly, combining the FIG. 3 matrix and the above equation, a mask pattern CD width (x) matrix for the example twelve-by-twelve representation may be created (FIG. 12).

Figure 13:
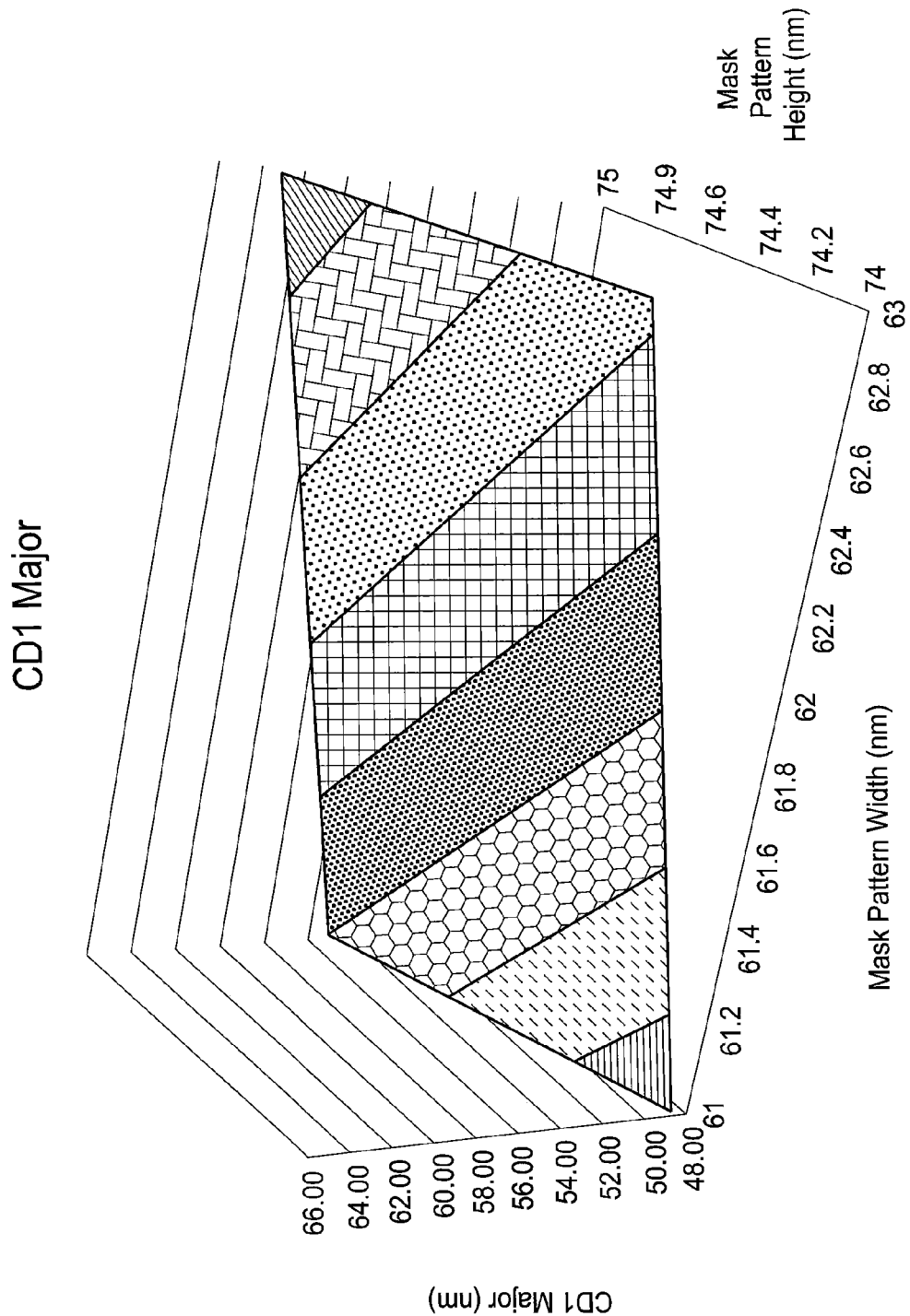

Referring to FIG. 13, such shows that predicted substrate feature y values vs. mask feature x and y values may vary independently with CD minor (FIGS. 3 and 4). FIG. 7 represents substrate feature target values for y. Yet, mask feature x values change at different field locations and FIG. 7 may be used in creating a two dimensional calculation for the mask feature y values as follows:

$$\text{Mask feature height }(y)=(\text{target substrate }y+626.3459-(4.8042\times\text{mask feature }x))/5.1635 \quad \text{(Equation 2)}$$

Then, combining FIG. 7 and Equation 2, the FIG. 14 matrix may be calculated and reflects mask feature CD height at the respective matrix locations.

An embodiment of the invention includes, among other limitations, calculating CD values for one of x and y for modified mask features if forming a modified E-beam-written mask having mask features modified from that E-beam-written mask that will improve substrate feature variation in the one of x and y directions. A mask matrix of CD values for the one of x and y of the modified features is then created. FIGS. 3, 4, 6, and 7 above and the text pertaining thereto are but example techniques of doing so.

Such embodiment of the invention also includes calculating CD values for the other of x and y for the modified mask features if forming the modified E-beam-written mask having the modified mask features that will improve substrate feature variation in the other of x and y directions. A mask matrix of CD values for that other of x and y of the modified mask features is created. FIGS. 8-14 above show but one example technique of such acts of calculating and creating for the other of x and y. Although the above example described with respect to FIGS. 8-14 show feature values and mask matrix creation being conducted for what is referred to as "x" first and "y" second, these orders may of course be reversed.

The above example embodiment described with reference to FIGS. 2-14 may be conducted or derived at using any suitable lithography simulation software, for example those described above.

Figure 15:
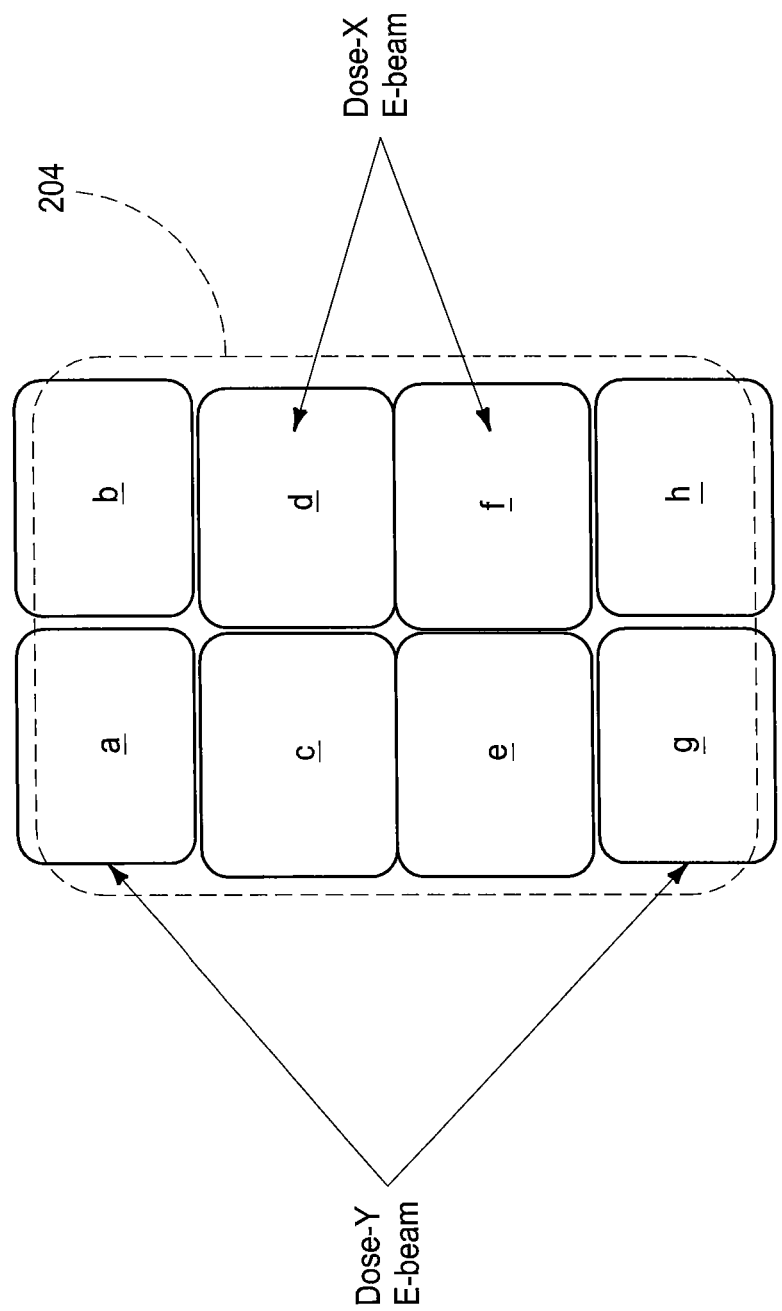
FIG. 15 is a diagrammatic top plan view of a single feature shown in FIG. 2 and eight example separate E-beam exposures/shots that may be used to form that feature.

In one embodiment, relationships among orthogonal x, y dimensions and at least one of variable E-beam dose and variable E-beam shape are determined if forming the modified mask features using E-beam exposures in forming individual of the modified mask features. Then, x and y dose and/or shape matrices are created using the determined relationships and the x and y mask matrices for forming the modified E-beam-written mask with an E-beam mask writer. For example, FIG. 15 shows an outline 204 of a single example mask feature of FIG. 2. By way of example, such mask feature 204 may be formed by multiple (eight as shown) exposure shots a, b, c, d, e, f, g, and h. In the depicted example, each exposure a-h is shown as being of the same size and shape (e.g., rectangular). Exposures c, d, e, and f primarily establish the mask feature width x-dimension and exposures a, b, g, and h primarily establish the mask feature height y-dimension. Shot shapes other than rectangular may of course be used. Dose with respect to two or more of a-h may be a variable used in determining ultimate x and y dimensions of the individual mask features formed for the modified mask. Such relationships may be determined experimentally through actual physical trials, or via simulation for example using litho-simulation products such as the Sentaurus Lithography™ product referred to above. Accordingly using the FIG. 15 example where E-beam exposure/shot shape may be constant in multiple exposures in forming a single modified mask feature, x and y dose matrices may be created for different of the modified mask features to result in the desired modified mask feature size and shape on the modified E-beam-written mask.

The above-described example in connection with FIG. 15 was with respect to determining relationships among x, y dimensions and E-beam dose for multiple E-beam exposures in forming individual modified mask features. However, embodiments of the invention also include determining relationships among orthogonal x, y dimensions and variable E-beam shape for multiple E-beam exposures in forming individual of the modified mask features. Regardless, the other of dose and shape may remain constant or also be a variable used in determining modification to formation of the modified mask features. In other words, only one of dose and shape could be varied or both of dose and shape could be varied in forming the modified mask.

The above-described processing starting with reference to FIG. 2 through the immediately preceding paragraph are but collective examples of carrying out step 100 in the example FIG. 1 embodiment. Others may be used and/or later developed.

In one embodiment, the modified E-beam-written mask is formed with the E-beam writer using the x and y dose and/or shape matrices, for example as described above with respect to the example embodiment of FIGS. 2-15. In doing so, in this example, the E-beam mask writer would be programmed accordingly in accordance with step 115 in the example FIG. 1 embodiment. One or more substrates would ultimately be photolithographically processed using the modified E-beam-written mask. Other attributes as described above may be employed.

CONCLUSION

In some embodiments, a method of forming a mask comprises creating a difference map between a desired intra-field pattern that is to be formed on substrates and an intra-field signature pattern. The intra-field signature pattern represents a pattern formed on an example substrate by an exposure field using an example E-beam-written mask. Modifications are determined to formation of mask features to be made using an E-beam mask writer if forming a modified E-beam-written mask having mask features modified from that of the example E-beam-written mask that will improve substrate feature variation identified in the difference map. The E-beam mask writer is programmed using the determined modifications to improve the substrate feature variation identified in the difference map. The programmed E-beam mask writer is used to form the modified E-beam-written mask having the modified mask features. One or more substrates are photolithographically processed using the modified E-beam-written mask.

In some embodiments, a method of forming a mask comprises creating a difference map between a desired intra-field pattern that is to be formed on semiconductor substrates and an intra-field signature pattern. The intra-field signature pattern is formed by photolithographically patterning an example substrate with an exposure field using an example E-beam-written mask and scanning the patterned example substrate. A difference map is created and comprises creating at least two matrices of critical dimension (CD) values along two different directions that are orthogonal relative one another. Modifications are determined to formation of mask features to be made using an E-beam mask writer if forming a modified E-beam-written mask having mask features modified from that of the example E-beam-written mask that will improve substrate feature variation identified in the difference map. The determining of the modifications comprises determining relationships among orthogonal x, y dimensions and variable E-beam dose if forming the modified mask features using multiple E-beam exposures in forming individual of the modified mask features. The E-beam mask writer is programmed using the determined modifications to improve the substrate feature variation identified in the difference map. The programmed E-beam mask writer is used to form the modified E-beam-written mask having the modified mask features. One or more semiconductor substrates are photolithographically processed using the modified E-beam-written mask.

In some embodiments, a method of correcting intra-field variation across a mask design used in photolithographic processing comprises creating a signature matrix of critical dimension (CD) values for each of orthogonal x and y directions of substrate features in an intra-field signature pattern. The x and y CD values are derived using physical trial or using simulation with respect to an example substrate by an exposure field using an example E-beam-written mask. A modified x substrate matrix is created and a modified y substrate matrix is created. The modified x and y substrate matrices have calculated CD values that erase deltas from target x CD values and from target y CD values for the respective substrate features. CD values are calculated for one of x and y for modified mask features if forming a modified E-beam-written mask having mask features modified from that of the example E-beam-written mask that will improve substrate feature variation in the one of x and y directions. A mask matrix of CD values is created for the one of x and y of the modified mask features. CD values are calculated for the other of x and y for the modified mask features if forming the modified E-beam-written mask having the modified mask features that will improve substrate feature variation in the other of x and y directions. A mask matrix of CD values is created for the other of x and y of the modified mask features. Relationships are determined among orthogonal x, y dimensions and at least one of variable E-beam dose and variable E-beam shape if forming the modified mask features using multiple E-beam exposures in forming individual of the modified mask features. X and y dose and/or shape matrices are created using the determined relationships and the x and y mask matrices for forming the modified E-beam-written mask with an E-beam mask writer. The modified E-beam-written mask is formed with the E-beam mask writer using the x and y dose and/or shape matrices. One or more substrates are photolithographically processed using the modified E-beam-written mask.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a mask, the mask comprising mask features thereon, the method comprising:
   creating a difference map between a desired intra-field pattern that is to be formed on substrates and an intra-field signature pattern, the intra-field signature pattern representing a pattern formed on an example substrate by an exposure field using an example E-beam-written mask;
   determining modifications to formation of mask features to be made using an E-beam mask writer if forming a modified E-beam-written mask having mask features modified from that of the example E-beam-written mask that will improve substrate feature variation identified in the difference map; the modifications being change in size, shape, and/or spacing of the mask features from size, shape, and/or spacing of the mask features before said determining of the modifications;
   programming the E-beam mask writer using the determined modifications to improve the substrate feature variation identified in the difference map;
   using the programmed E-beam mask writer to form the modified E-beam-written mask having the modified mask features; the modified mask features having the changed size, shape, and/or spacing on the modified E-beam-written mask; and
   photolithographically processing one or more substrates using the modified E-beam-written mask.

2. The method of claim 1 wherein the intra-field signature pattern is derived from physical trial.

3. The method of claim 2 wherein the example substrate is a physical substrate and the example E-beam-written mask is a physical mask, and the represented pattern is formed by photolithographically patterning the physical substrate using the example physical mask and deriving the intra-field signature pattern by scanning the patterned physical substrate.

4. The method of claim 1 wherein the intra-field signature pattern is derived from at least some simulation.

5. The method of claim 4 wherein the example substrate is a virtual substrate and the example E-beam-written mask is a virtual mask, and the represented pattern is formed by virtually photolithographically patterning the virtual substrate with the virtual mask and deriving the intra-field signature pattern there-from.

6. The method of claim 1 wherein creating the difference map includes comparison of distances along at least two different directions, the programming and the forming of the modified mask improving substrate feature variation in the at least two different directions.

7. The method of claim 1 wherein creating the difference map includes comparison of distances along at least two directions which are orthogonal to one another, the programming and the forming of the modified mask improving substrate feature variation in the two orthogonal directions.

8. The method of claim 1 wherein the photolithographically processed substrate is a semiconductor substrate, and the photolithographic processing patterns one or more components of a memory array.

9. The method of claim 1 wherein the photolithographically processed substrate is a semiconductor substrate, and the photolithographic processing patterns one or more components of a DRAM array.

10. The method of claim 1 wherein the photolithographically processed substrate is a semiconductor substrates, and the photolithographic processing patterns one or more components of a NAND array.

11. The method of claim 1 wherein creating the difference map comprises creating a matrix of critical dimension (CD) values along a direction.

12. The method of claim 1 wherein creating the difference map comprises creating matrices of critical dimension (CD) values along different directions.

13. The method of claim 12 comprising two matrices of different respective directions that are orthogonal relative one another.

14. The method of claim 1 wherein determining the modifications comprises determining relationships among orthogonal x, y dimensions and variable E-beam dose if forming the modified mask features using multiple E-beam exposures in forming individual of the modified mask features.

15. The method of claim 14 if using multiple E-beam exposures of constant size and shape, and at least two different doses in forming individual of the modified mask features.

16. The method of claim 1 wherein determining the modifications comprises determining relationships among orthogonal x, y dimensions and variable E-beam shape if forming the modified mask features using multiple E-beam exposures in forming individual of the modified mask features.

17. The method of claim 16 if using multiple E-beam exposures of constant dose and at least two different shapes in forming individual of the modified mask features.

18. The method of claim 1 wherein the modified mask is a reticle.

19. The method of claim 1 comprising improving substrate feature variation in terms of critical dimension (CD) value uniformity in at least one direction of commonly shaped and sized substrate features.

20. The method of claim 19 comprising improving substrate feature variation in terms of CD value uniformity in two orthogonal directions of commonly shaped and sized substrate features.

21. The method of claim 1 comprising improving substrate feature variation in terms of critical dimension (CD) bias in at least one direction of different size substrate features.

22. The method of claim 21 comprising improving substrate feature variation in terms of CD bias in two orthogonal directions of different size substrate features.

23. The method of claim 1 comprising improving substrate feature variation in terms of critical dimension (CD) value uniformity in two orthogonal directions of commonly shaped and sized substrate features, and improving substrate feature variation in terms of CD bias in the two orthogonal directions of different size substrate features.

24. A method of forming a mask, comprising:
   creating a difference map between a desired intra-field pattern that is to be formed on substrates and an intra-field signature pattern, the intra-field signature pattern representing a pattern formed on an example substrate by an exposure field using an example E-beam-written mask;

determining modifications to formation of mask features to be made using an E-beam mask writer if forming a modified E-beam-written mask having mask features modified from that of the example E-beam-written mask that will improve substrate feature variation identified in the difference map;

programming the E-beam mask writer using the determined modifications to improve the substrate feature variation identified in the difference map;

using the programmed E-beam mask writer to form the modified E-beam-written mask having the modified mask features;

photolithographically processing one or more substrates using the modified E-beam-written mask; and wherein determining the modifications comprises using a feedback loop in creating multiple difference maps between the desired intra-field pattern and multiple intra-field signature patterns derived by simulation from forming different respective theoretical E-beam-written masks, wherein at least some subsequent of the theoretical E-beam-written masks would improve substrate feature variation identified in its difference map.

25. A method of forming a mask, comprising:

creating a difference map between a desired intra-field pattern that is to be formed on substrates and an intra-field signature pattern, the intra-field signature pattern representing a pattern formed on an example substrate by an exposure field using an example E-beam-written mask;

determining modifications to formation of mask features to be made using an E-beam mask writer if forming a modified E-beam-written mask having mask features modified from that of the example E-beam-written mask that will improve substrate feature variation identified in the difference map;

programming the E-beam mask writer using the determined modifications to improve the substrate feature variation identified in the difference map;

using the programmed E-beam mask writer to form the modified E-beam-written mask having the modified mask features;

photolithographically processing one or more substrates using the modified E-beam-written mask; and wherein determining the modifications comprises using a feedback loop in creating multiple difference maps between the desired intra-field pattern and multiple intra-field signature patterns derived by physical trial from forming different respective physical E-beam-written masks, wherein at least some subsequent of the physical E-beam-written masks improve substrate feature variation identified in its difference map.

26. A method of forming a mask, the mask comprising mask features thereon, the method comprising:

creating a difference map between a desired intra-field pattern that is to be formed on semiconductor substrates and an intra-field signature pattern, the intra-field signature pattern being formed by photolithographically patterning an example substrate with an exposure field using an example E-beam-written mask and scanning the patterned example substrate, creating the difference map comprising creating at least two matrices of critical dimension (CD) values along two different directions that are orthogonal relative one another;

determining modifications to formation of mask features to be made using an E-beam mask writer if forming a modified E-beam-written mask having mask features modified from that of the example E-beam-written mask that will improve substrate feature variation identified in the difference map, determining of the modifications comprising determining relationships among orthogonal x, y dimensions and variable E-beam dose if forming the modified mask features using multiple E-beam exposures in forming individual of the modified mask features; the modifications being change in size, shape, and/or spacing of the mask features from size, shape, and/or spacing of the mask features before said determining of the modifications;

programming the E-beam mask writer using the determined modifications to improve the substrate feature variation identified in the difference map;

using the programmed E-beam mask writer to form the modified E-beam-written mask having the modified mask features; the modified mask features having the changed size, shape, and/or spacing on the modified E-beam-written mask; and photolithographically processing one or more semiconductor substrates using the modified E-beam-written mask.

27. The method of claim 26 wherein the photolithographically processed substrate is a semiconductor substrate and the photolithographic processing patterns one or more components of a memory array.

28. The method of claim 26 wherein the photolithographically processed substrate is a semiconductor substrate and the photolithographic processing patterns one or more components of a DRAM array.

29. The method of claim 26 wherein the photolithographically processed substrate is a semiconductor substrate and the photolithographic processing patterns one or more components of a NAND array.

* * * * *